US010256106B2

(12) United States Patent
Chang et al.

(10) Patent No.: US 10,256,106 B2
(45) Date of Patent: *Apr. 9, 2019

(54) SACRIFICIAL SHORTING STRAPS FOR SUPERCONDUCTING QUBITS

(71) Applicant: INTERNATIONAL BUSINESS MACHINES CORPORATION, Armonk, NY (US)

(72) Inventors: Josephine B. Chang, Bedford Hills, NY (US); Douglas T. McClure, III, Rye, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/887,297

(22) Filed: Feb. 2, 2018

(65) Prior Publication Data

US 2018/0174852 A1    Jun. 21, 2018

Related U.S. Application Data

(63) Continuation of application No. 15/349,195, filed on Nov. 11, 2016, now Pat. No. 10,032,637, which is a
(Continued)

(51) Int. Cl.
*H01L 29/66* (2006.01)
*H01L 21/3065* (2006.01)
(Continued)

(52) U.S. Cl.
CPC .... *H01L 21/3065* (2013.01); *H01L 29/66977* (2013.01); *H01L 39/025* (2013.01); *H01L 39/223* (2013.01); *H01L 39/2493* (2013.01)

(58) Field of Classification Search
CPC .. H01L 39/223; H01L 39/025; H01L 39/2493
(Continued)

(56) References Cited

U.S. PATENT DOCUMENTS 9,515,247 B1    12/2016 Chang et al.
9,705,063 B2    7/2017 Chang et al.
(Continued)

OTHER PUBLICATIONS

List of IBM Patents or Patent Applications Treated as Related; (Appendix P), Filed Feb. 2, 2018; pp. 1-2.

*Primary Examiner* — Fernando L Toledo
*Assistant Examiner* — Adam S Bowen
(74) *Attorney, Agent, or Firm* — Cantor Colburn LLP; Vazken Alexanian

(57) ABSTRACT

A technique relates to protecting a tunnel junction. A first electrode paddle and a second electrode paddle are on a substrate. The first and second electrode paddles oppose one another. A sacrificial shorting strap is formed on the substrate. The sacrificial shorting strap connects the first electrode paddle and the second electrode paddle; The tunnel junction is formed connecting the first electrode paddle and the second electrode paddle, after forming the sacrificial shorting strap. The substrate is mounted on a portion of a quantum cavity. The portion of the quantum cavity is placed in a vacuum chamber. The sacrificial shorting strap is etched away in the vacuum chamber while the substrate is mounted to the portion of the quantum cavity, such that the sacrificial shorting strap no longer connects the first and second electrode paddles. The tunnel junction has been protected from electrostatic discharge by the sacrificial shorting strap.

20 Claims, 13 Drawing Sheets

Related U.S. Application Data continuation of application No. 14/714,894, filed on May 18, 2015, now Pat. No. 9,515,247.

(51) Int. Cl.
*H01L 39/22* (2006.01)
*H01L 39/24* (2006.01)
*H01L 39/02* (2006.01)

(58) Field of Classification Search
USPC .......................................................... 257/31
See application file for complete search history.

(56) References Cited

U.S. PATENT DOCUMENTS

2014/0113828 A1\* 4/2014 Gilbert .................. H01L 39/126
505/100
2017/0062228 A1 3/2017 Chang et al.

\* cited by examiner

FIG. 4
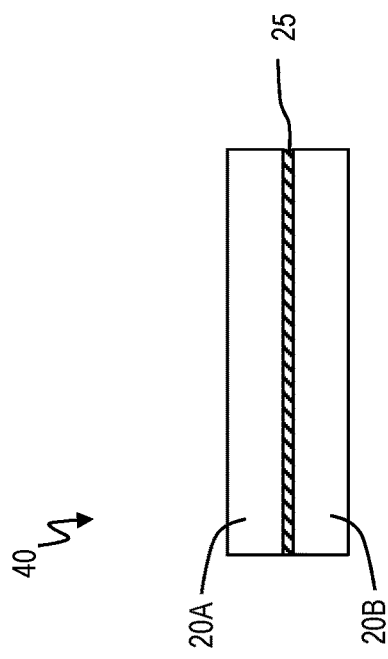
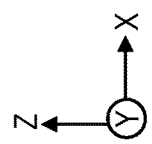

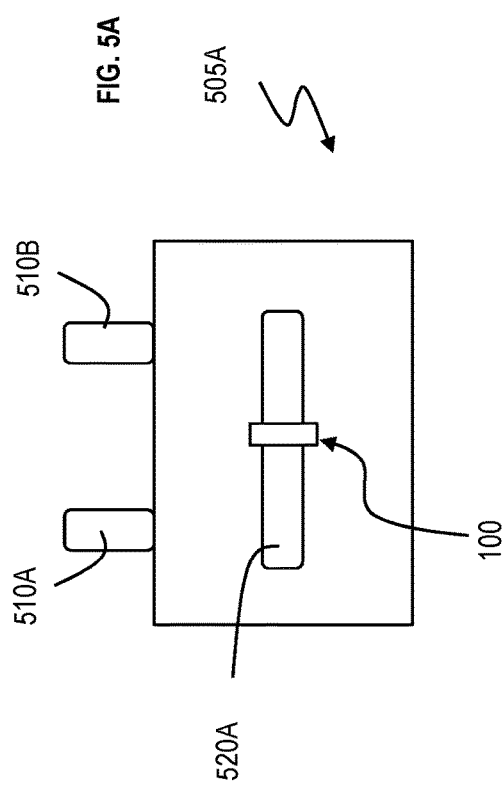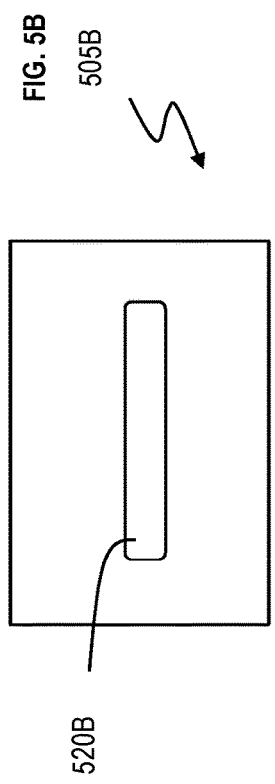

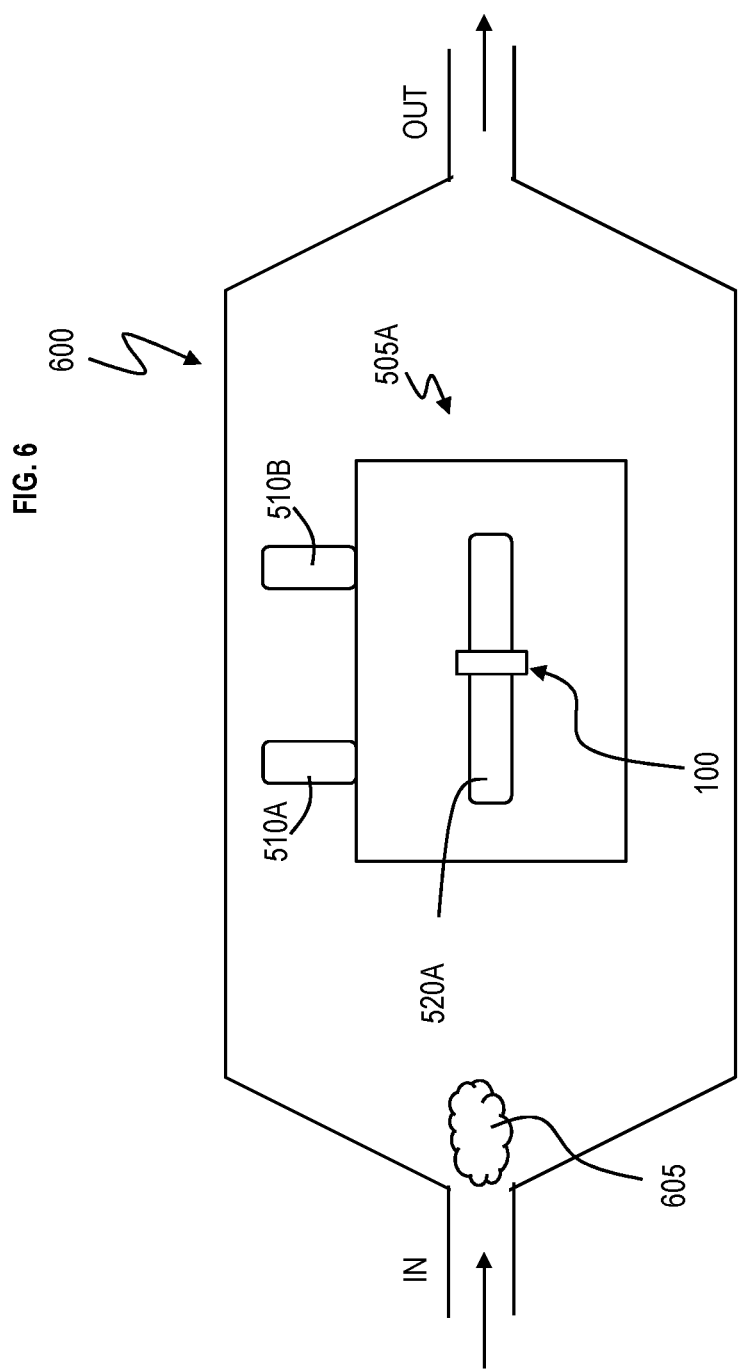

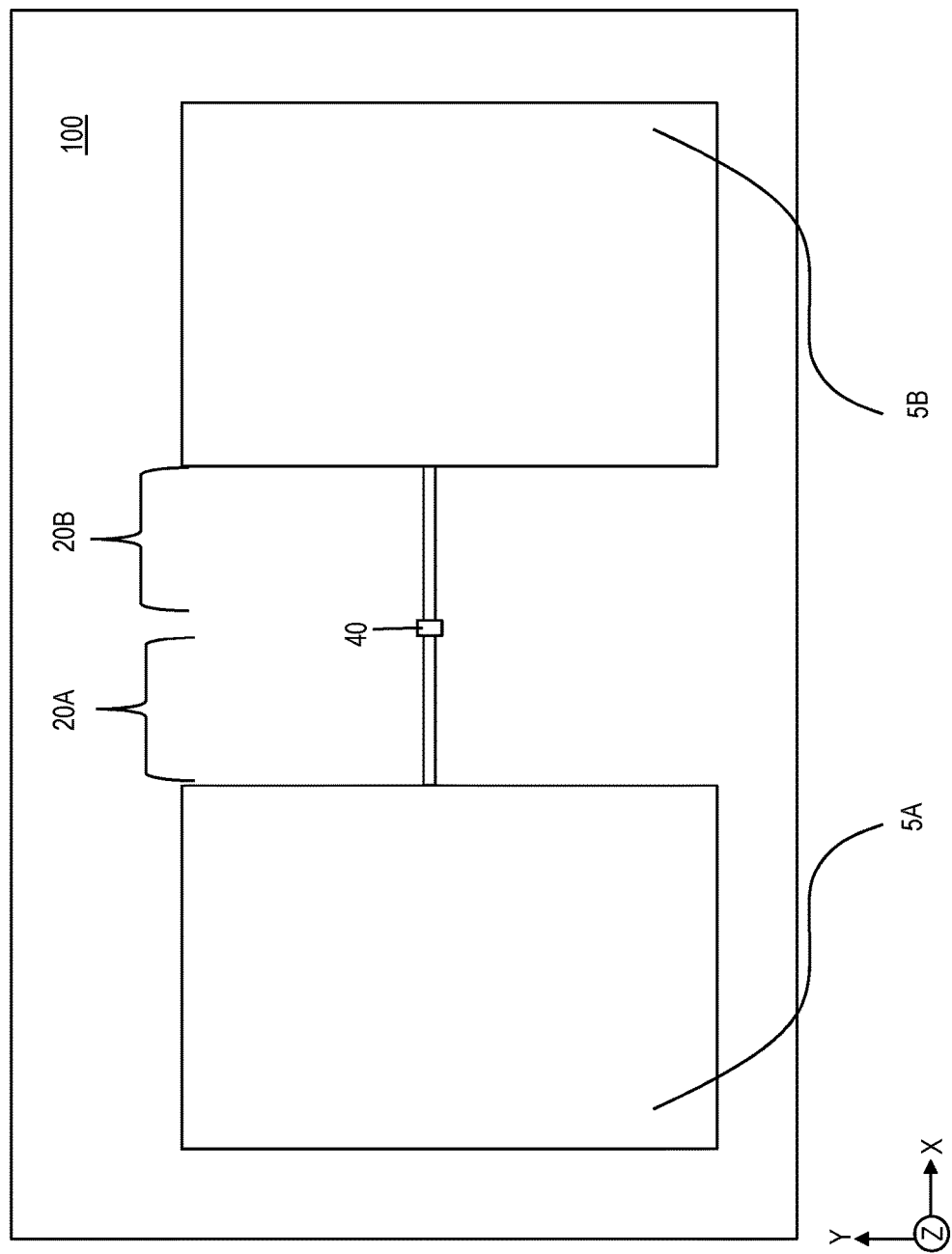

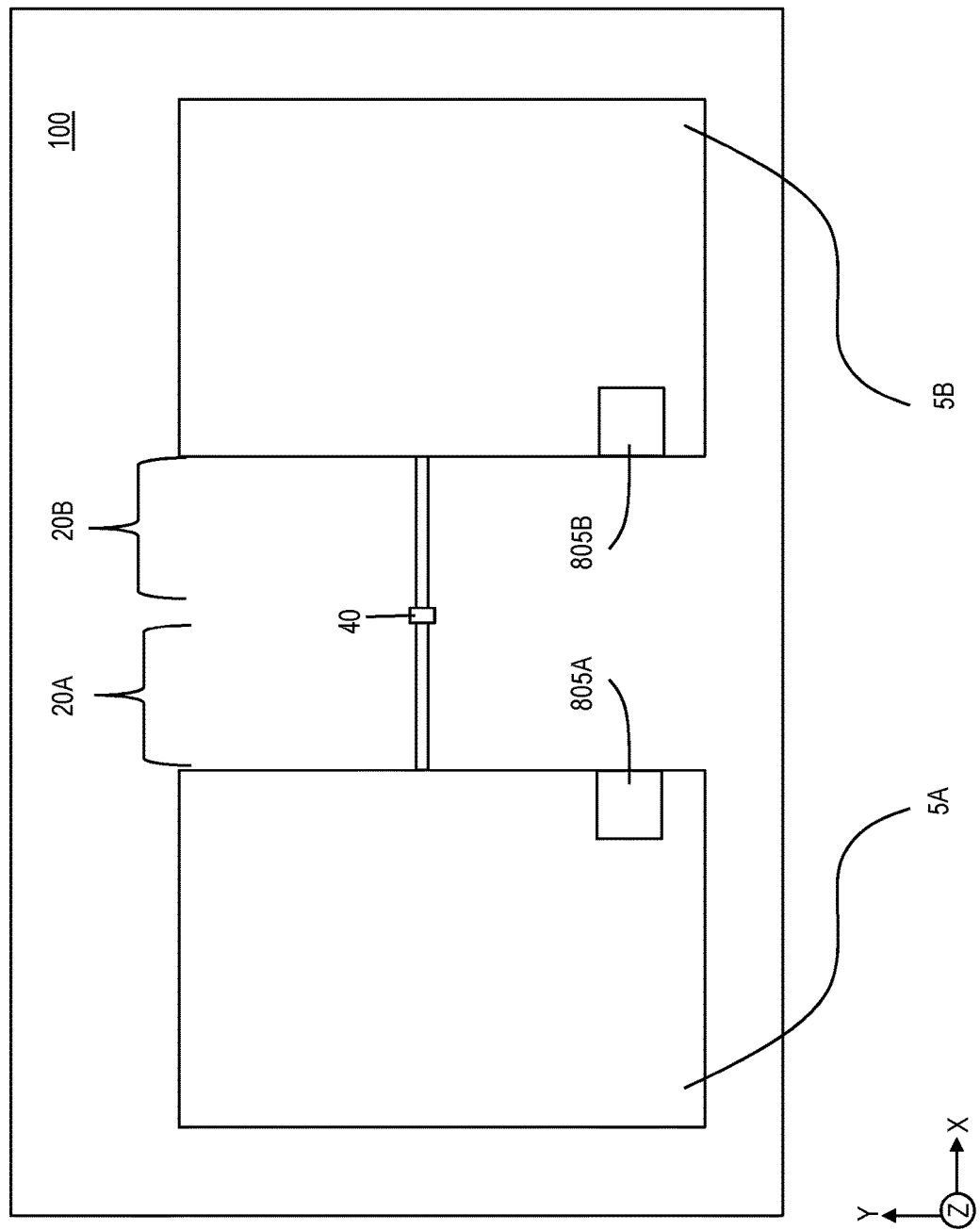

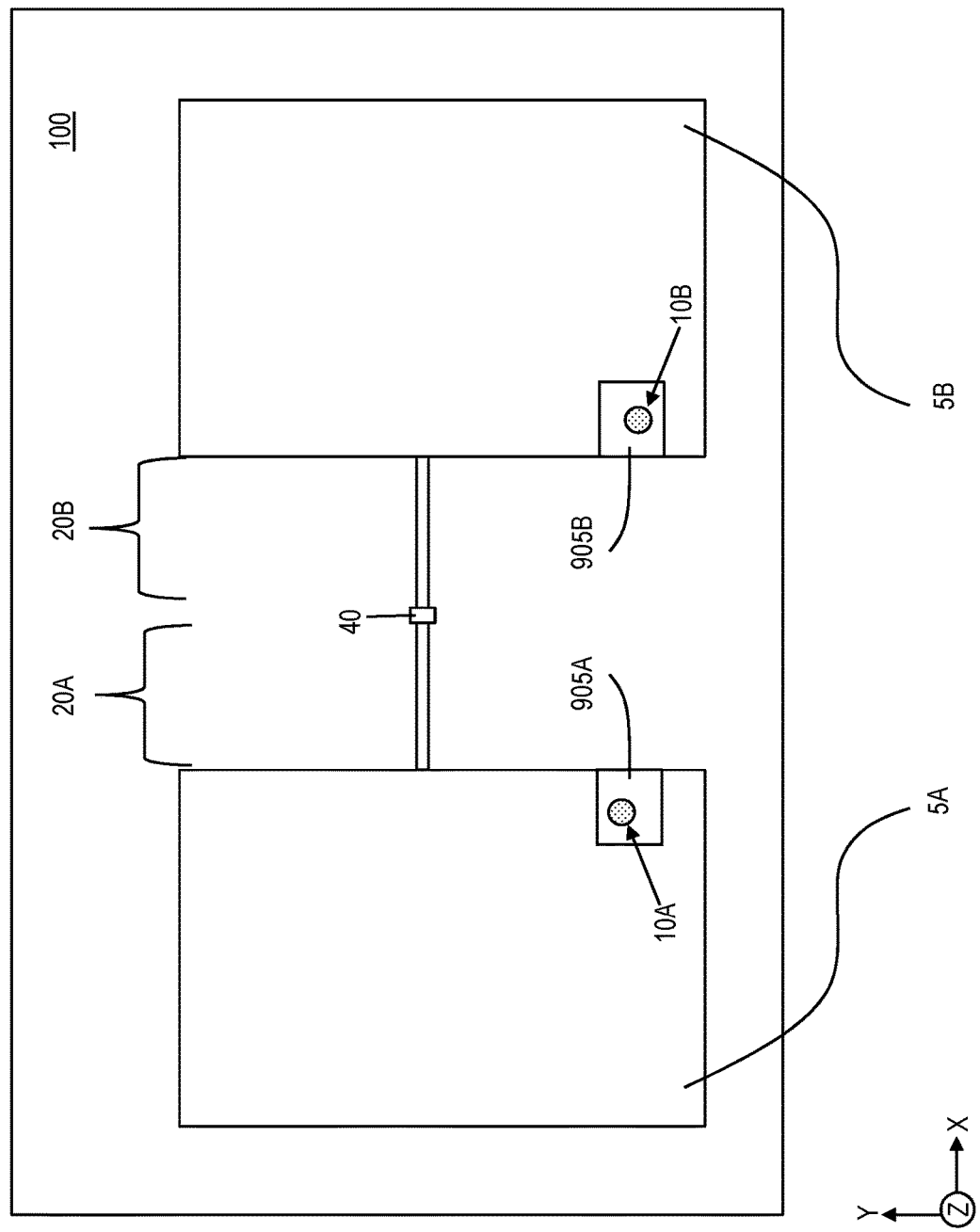

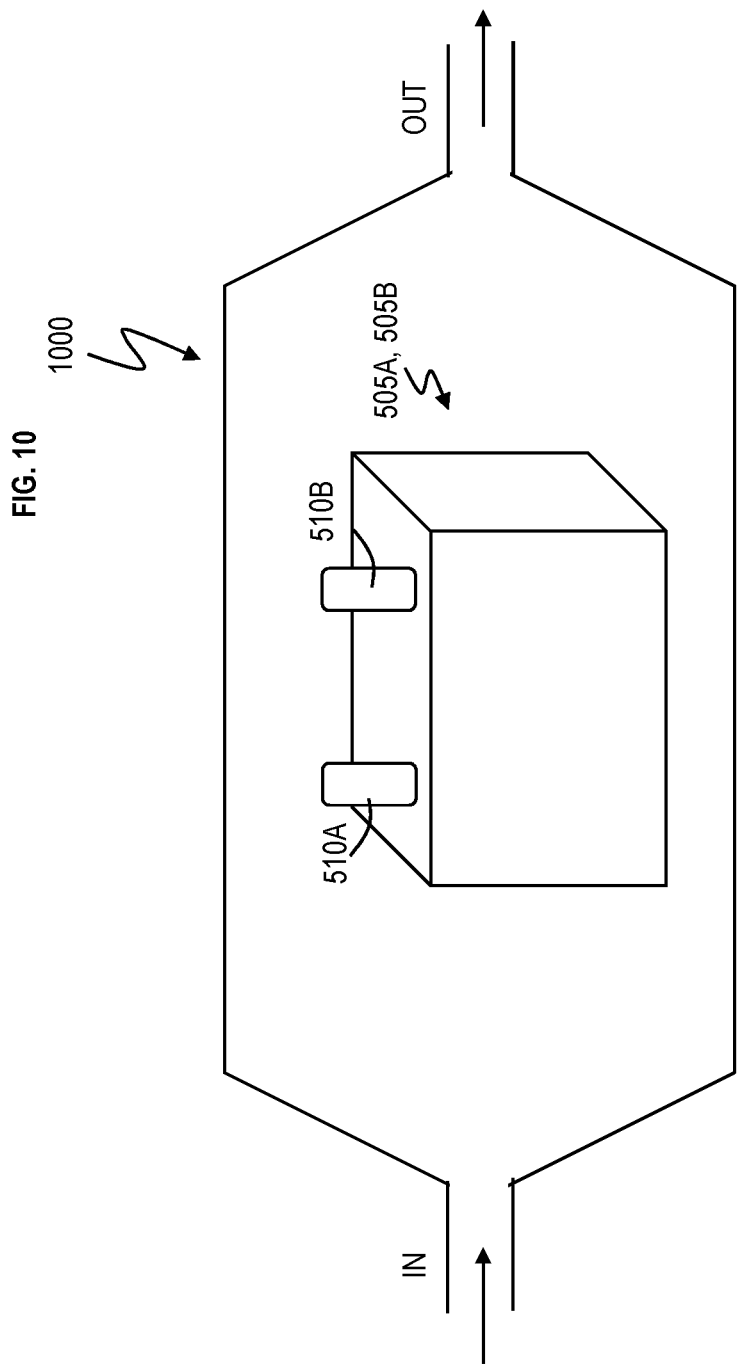

FIG. 11A 1100 

FORM A FIRST ELECTRODE PADDLE AND A SECOND ELECTRODE PADDLE ON A SUBSTRATE, THE FIRST ELECTRODE PADDLE AND THE SECOND ELECTRODE PADDLE OPPOSING ONE ANOTHER 1105

↓

FORM THE SACRIFICIAL SHORTING STRAP ON THE SUBSTRATE, THE SACRIFICIAL SHORTING STRAP CONNECTING THE FIRST ELECTRODE PADDLE AND THE SECOND ELECTRODE PADDLE 1110

↓

FORM THE TUNNEL JUNCTION CONNECTING THE FIRST ELECTRODE PADDLE AND THE SECOND ELECTRODE PADDLE, AFTER FORMING THE SACRIFICIAL SHORTING STRAP 1115

↓

MOUNT THE SUBSTRATE ON A PORTION OF A QUANTUM CAVITY 1120

↓

PLACE THE PORTION OF THE QUANTUM CAVITY IN A VACUUM CHAMBER 1125

SACRIFICIAL SHORTING STRAPS FOR SUPERCONDUCTING QUBITS

DOMESTIC BENEFIT/NATIONAL STAGE INFORMATION

This application is a continuation of and claims priority to U.S. patent application Ser. No. 15/349,195, filed on Nov. 11, 2016, entitled "SACRIFICIAL SHORTING STRAPS FOR SUPERCONDUCTING QUBITS", which is a continuation of and claims priority to U.S. application Ser. No. 14/714,894, filed on May 18, 2015, and which is now U.S. Pat. No. 9,515,247, entitled "SACRIFICIAL SHORTING STRAPS FOR SUPERCONDUCTING QUBITS", the entire contents of which are incorporated herein by reference.

STATEMENT REGARDING FEDERALLY SPONSORED RESEARCH OR DEVELOPMENT

This invention was made with Government support under Contract No.: W911NF-10-1-0324 awarded by the Intelligence Advanced Research Projects Activity. The Government has certain rights to this invention.

BACKGROUND

The present invention relates to superconducting techniques, and more specifically, to a sacrificial shorting strap for superconducting qubits.

Quantum computing employs resonant structures called qubits to store information, and resonators (e.g., as a two-dimensional (2D) planar waveguide or as a three-dimensional (3D) microwave cavity) to read out and manipulate the qubits. To date, a major focus has been on improving lifetimes of the qubits in order to allow calculations (i.e., manipulation and readout) to take place before the information is lost to decoherence of the qubits. Currently, qubit coherence times can be as high as 100 microseconds and efforts are being made to increase the coherence times. One area of research with respect to increasing coherence times is focused on eliminating material at the edges of the qubit (i.e., edges) in order to reduce the electric field in that area. The material in proximity to the qubit includes imperfections that support defects known as two-level systems (TLS).

SUMMARY

According to one embodiment, a method of forming a protected tunnel junction is provided. The method includes forming a first electrode paddle and a second electrode paddle on a substrate, where the first electrode paddle and the second electrode paddle oppose one another, and forming a sacrificial shorting strap on the substrate, where the sacrificial shorting strap connects the first electrode paddle and the second electrode paddle. The method includes forming the tunnel junction connecting the first electrode paddle and the second electrode paddle, after forming the sacrificial shorting strap, mounting the substrate on a portion of a quantum cavity, and placing the portion of the quantum cavity in a vacuum chamber. Also, the method includes etching away the sacrificial shorting strap in the vacuum chamber while the substrate is mounted to the portion of the quantum cavity, such that the sacrificial shorting strap no longer connects the first electrode paddle and the second electrode paddle, and placing the quantum cavity in a cooling chamber for operation. The tunnel junction has been protected from electrostatic discharge by the sacrificial shorting strap.

According to one embodiment, a system for protecting a tunnel junction from electrostatic discharge when handling the tunnel junction. The system includes a quantum cavity configured as a waveguide enclosure, and an assembly mounted to the quantum cavity. The assembly includes a first electrode paddle and a second electrode paddle on a substrate, where the first electrode paddle and the second electrode paddle oppose one another. Also, the assembly includes the tunnel junction connecting the first electrode paddle and the second electrode paddle, a first location on the first electrode paddle, and a second location on the second electrode paddle. The first electrode paddle has a first raised portion at the first location and the second electrode paddle has a second raised portion at the second location. The first raised portion corresponds to one end of a sacrificial shorting strap previously connected at the first location on the first electrode paddle. The second raised portion corresponds to another end of the sacrificial shorting strap previously connected at the second location on the second electrode paddle.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 is a cross-sectional view of superconducting tunnel junction according to an embodiment;

FIG. 5A is a cross-sectional view of a first portion of a 3D quantum cavity with the substrate mounted to the cavity according to an embodiment;

FIG. 5B is a cross-sectional view of the second portion of the 3D quantum cavity according to an embodiment;

FIG. 6 is a conceptual view of a vacuum chamber for removing the sacrificial shorting strap according to an embodiment;

FIG. 7 is a top view of the substrate after removing the sacrificial shorting strap according to an embodiment;

FIG. 8 is a top view illustrating that raised portions of the two paddles may remain at the locations in which the shorting strap previously contacted the paddles according to an embodiment;

FIG. 9 is a top view illustrating that remnants of the removed shorting strap remains according to an embodiment;

FIG. 10 is a conceptual view of a cooling chamber housing the complete 3D cavity according to an embodiment;

FIGS. 11A and 11B together illustrate a method of providing a sacrificial shorting strap for protecting the tunnel junction of a superconducting qubit according to an embodiment.

DETAILED DESCRIPTION

Three-dimensional (3D) superconductor qubits suffer from electrostatic discharge effects, due to the antenna effect of its two large paddles, each of which is attached to opposite sides of a delicate tunnel junction.

State-of-the-art solutions include the use of a shorting strap which is manually cut through immediately before testing, leaving one end of the severed shorting strap attached to the one large paddle and the other end of the severed shorting strap attached to the other large paddle. However, this process is not scalable and introduces particulates and lossy features into the qubit system. Particles of the cut shorting strap are spewed onto and left on the two large paddles even in proximity to the delicate tunnel junction. Other lossy features incurred in this process include damage to the underlying substrate and residue left from the severing process.

Embodiments present the use of sacrificial shorting straps (e.g., niobium (Nb)), which can be removed using a vapor etchant (e.g., $XeF_2$) or a wet etchant after processing and device mounting are completely finished. This eliminates the extraneous capacitance caused by the remnant shorting strap features (i.e., particles and/or severed shorting straps attached to the two large paddles). As one example, a process for fabricating 3D superconducting qubits is to make aluminum (Al) paddles and Al/AlO$_x$/Al tunnel junctions on a sapphire substrate. In such a device, all components are resilient to $XeF_2$ etching according to an embodiment.

According to embodiments, the technique teaches the fabrication of a niobium (or other conductive material which can be etched by $XeF_2$ or other vapor etchant) shorting strap before the fabrication of the Al/AlOx/Al tunnel junction. Forming the sacrificial shorting strap can be either before or after paddle formation. After junction fabrication, dicing, and mounting, the sacrificial shorting strap is then removed using $XeF_2$.

Figure 1:
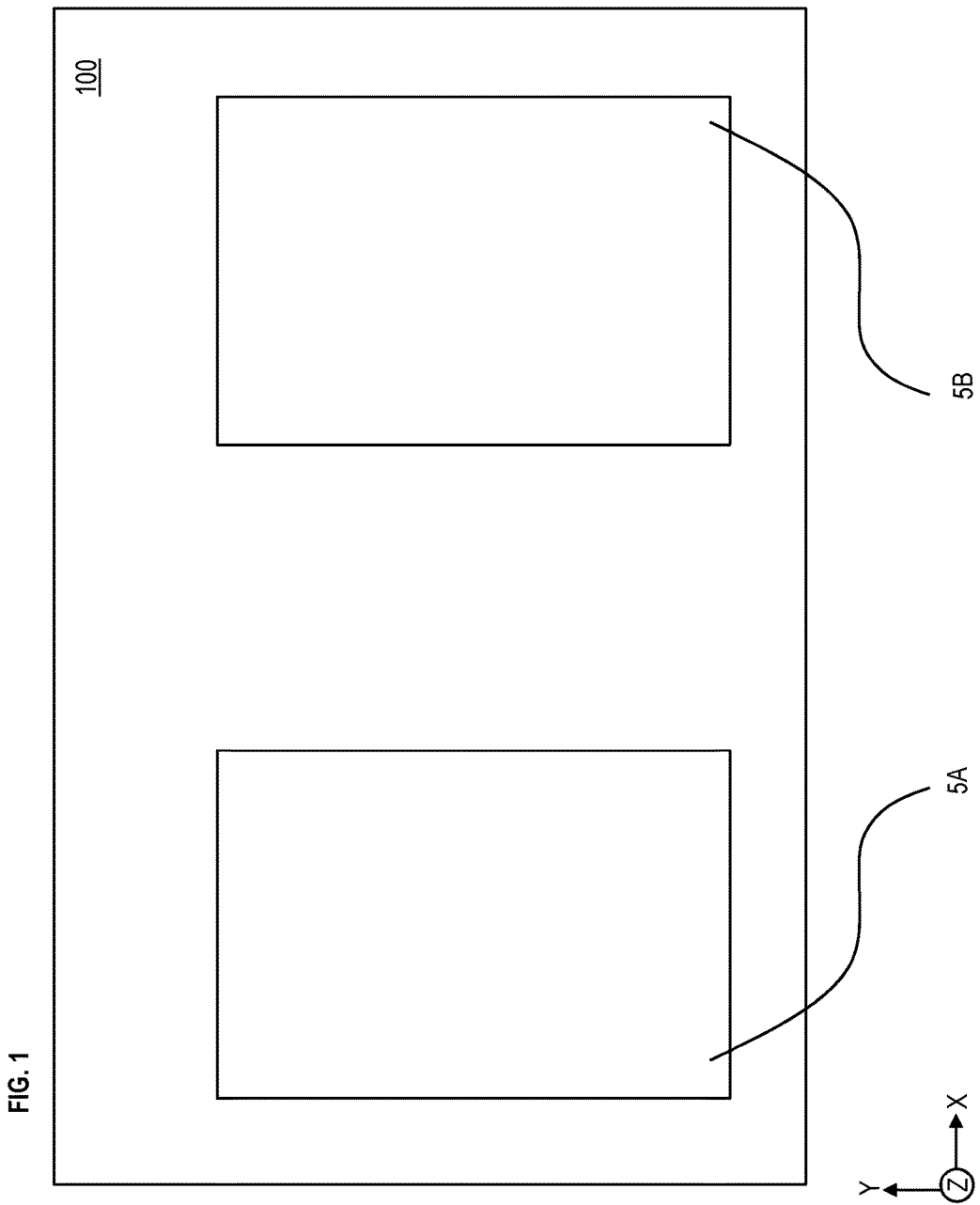
FIG. 1 is a top view of two paddles utilized to form a superconducting qubit on a substrate according to an embodiment.

FIG. 1 is a top view according to an embodiment. FIG. 1 illustrates a substrate 100 with two paddles 5A and 5B according to an embodiment. The substrate 100 may be, e.g., silicon, germanium, sapphire, etc.

A conductive layer may be deposited on top of the substrate 100, and the two paddles (pads) 5A and 5B are etched from the conductive layer. The two paddles 5A and 5B may be made of a superconductive material, such as aluminum, titanium nitride, niobium, and/or niobium nitride.

Superconductivity is the phenomenon wherein the electrical resistance of a metal disappears when the metal is cooled. Superconductivity occurs in a variety of metals, but only when they are cooled to extremely low temperatures, e.g., near absolute zero.

Figure 2:
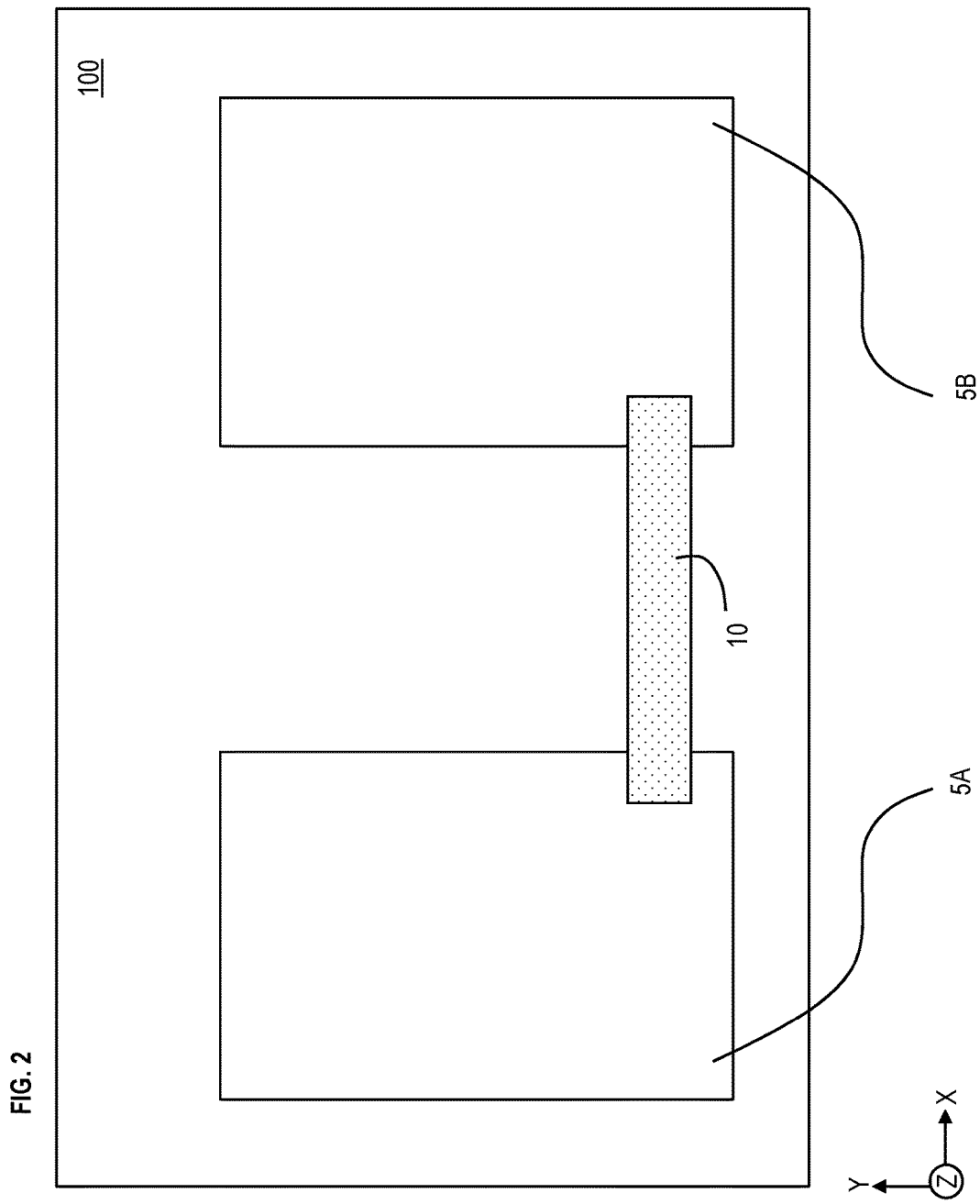
FIG. 2 is a top view of a conductive, sacrificial shorting strap formed to connect the two paddles according to an embodiment.

FIG. 2 is a top view according to an embodiment. FIG. 2 illustrates that a conductive (sacrificial) shorting strap 10 is formed to electrically connect paddles 5A and 5B. One end of the conductive shorting strap 10 touches and/or is on top of the paddle 5A. The other end of the conductive shorting strap 10 touches and/or is on top of the paddle 5B. The conductive shorting strap 10 is an electrical shunt for electrostatic discharge while providing a path to bypass the path of the delicate tunnel junction (e.g., tunnel junction 40 shown in FIG. 3). The shorting strap 10 may be formed by depositing the conductive material and etching to the desired shape.

The conductive shorting strap 10 is made of a material that is highly selectable for etching by an etchant while not etching other material as discussed further herein. In one implementation, the shorting strap 10 may be a superconducting material such as, e.g., niobium (Nb), aluminum (Al), titanium nitride (TiN), niobium boride (NbB), where the strap material can be etched selectively (compared) to other layers on the substrate 100. In the case of a superconducting strap, residue that is not completely removed would not be lossy. In another implementation, the shorting strap 10 may be a material that is not superconducting but at least mildly conductive, such as, e.g., copper (Cu), silicon (Si), amorphous Si, or a conductive polymer, where the strap material can be etched selectively (compared) to other layers on the substrate 100 and which can be removed cleanly without residue.

As one example, when the substrate 100 is not silicon, e.g., the substrate 100 may be sapphire, the shorting strap 10 may be silicon, and the etchant is configured to select silicon while not selecting the other layers on the substrate 100.

Figure 3:
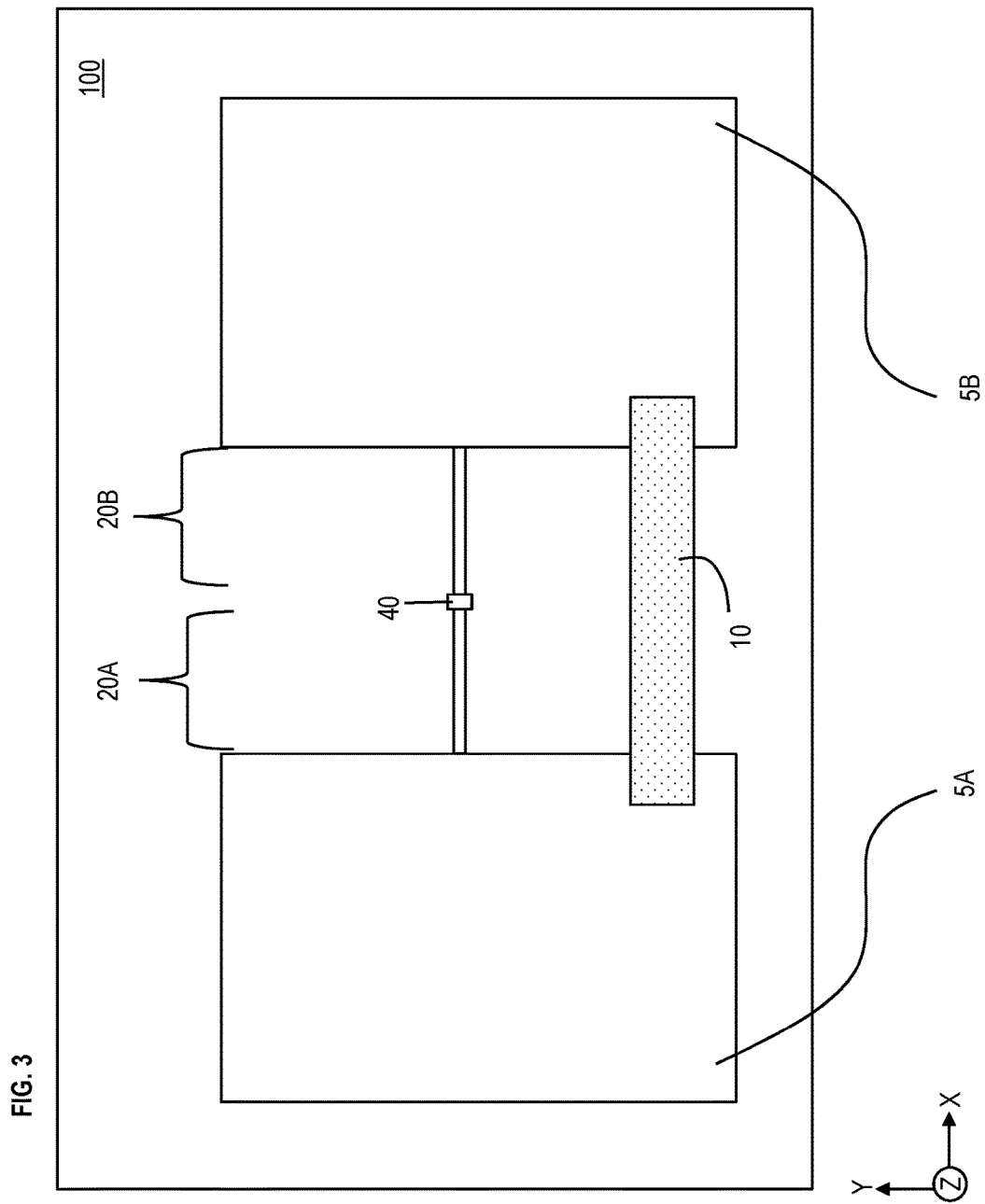
FIG. 3 is a top view representing fabrication of the superconducting tunnel junction on the substrate according to an embodiment.

FIG. 3 is a top view representing fabrication of the superconducting tunnel junction 40 on the substrate 100. The superconducting tunnel junction 40 is connected to the paddles 5A and 5B via electrodes 20A and 20B. The electrode 20A of the tunnel junction 40 is connected to and touching paddle 5A, while the electrode 20B of the tunnel junction 40 is connected to and touching paddle 5B.

The process of fabricating the superconducting tunnel junction 40 is understood by one skilled in the art. The superconducting tunnel junction (STJ), also known as a superconductor-insulator-superconductor tunnel junction (SIS), is an electronic device consisting of two superconductors separated by a very thin layer of insulating material. Current passes through the junction via the process of quantum tunneling. The STJ is a type of Josephson junction and is part of the qubit. As an example, FIG. 4 is a cross-sectional view of the tunnel junction 40 according to an embodiment. FIG. 4 shows the electrodes 20A and 20B sandwiching a thin insulator layer 25. The electrodes 20A and 20B may be made of a superconducting material, such as aluminum (Al), titanium nitride (TiN), niobium (Nb), and/or niobium nitride (NbN). In one implementation, the electrodes 20A and 20B may be made of the same superconducting material of the paddles 5A and 5B. The insulator layer 25 may be an oxide such as, e.g., aluminum oxide (AlO) and/or silicon nitride (SiN).

The thickness (in the z-axis) of the electrodes 20A and 20B may be 50 nanometers (nm) to 500 nm. The thickness of the insulator layer 25 is such that, when separating the two superconducting electrodes 20A and 20B, the insulator layer 25 is thin enough so that electrons can quantum-mechanically tunnel through the barrier, as understood by one skilled in the art.

As noted above, three-dimensional (3D) superconductor tunnel junction 40 can suffer from electrostatic discharge effects, due to the antenna effect of the two large paddles 5A and 5B, each of which is attached to opposite sides of the delicate tunnel junction 40 via the electrodes 20A and 20B. However, the shorting strap 10 has a lower resistance than the superconducting tunnel junction 40 thus allowing the shorting strap 10 to act as an electrical shunt whenever electrostatic energy is discharged between the paddles 5A and 5B, all while avoiding electrostatic discharge through the high resistance tunnel junction 40. Accordingly, the substrate 100 can be physically handled by an operator without blowing the insulator 25, because the electrostatic discharge flows through the conductive shorting strap 10 instead. Blowing the insulator layer 25 denotes forming holes in the insulator layer 25, thus preventing the insulator layer 25 from performing as an insulator layer 25. It is noted that the shorting strap 10 is not required to be a highly conductive material, as long as the shorting strap 10 has a lower resistance than the tunnel junction 40.

FIG. 5A illustrates a first portion 505A of the 3D cavity and FIG. 5B illustrates a second portion 505B of the 3D cavity. The first and second portions 505A and 505B are each one-half of the 3D cavity, and both halves are attached together to form the 3D cavity (enclosure) as understood by one skilled in the art. The first and second portions 505A and 505B may be attached together with screws, clamps, and/or any other attaching device for microwave cavities as understood by one skilled in the art. This is one example of a 3D cavity and one skilled in the art understands that there are other types of 3D cavities. The 3D cavity may also be referred to as a quantum cavity, microwave cavity, waveguide enclosure, etc., for controlling the frequency of the circuit on the substrate 100. The combined portions 505A and 505B may be an enclosed box of a few centimeters or inches in length, width, and depth.

FIG. 5A shows the first portion 505A (e.g., one half) of the 3D cavity with an input port 510A and an output port 510B for inputting and outputting microwave signals to/from the substrate 100. In one implementation, the input port 510A and the output port 510B may be female inputs for attaching coaxial cables. It is noted that the substrate 100 (with the layers forming a circuit) may be considered a chip or assembly that has been diced for use. The substrate 100 is mounted to the first portion 505A across an elongated hole 520A within the first portion 505A. The substrate 100 may be mounted using screws or an adhesive.

FIG. 5B shows the second portion 505B (e.g., other half) of the 3D cavity. The second portion 505B has an elongated hole 520B that matches up with the elongated hole 520A in the first potion 505A, when the first and second portions 505A and 505B are combined. Although the substrate 100 (i.e., chip) is fixed to the first portion 505A, in one implementation, the substrate 100 may be fixed to the second portion 505B across the elongated hole 520B. In another implementation, the substrate 100 may be fixed in the elongated hole 520A or 520B.

The first portion 505A and the second portion 505B are made of the same material. The first and second portions 505A and 505B of the 3D cavity are made of copper, for example.

FIG. 6 is a conceptual view of a vacuum chamber 600 for deposition of material and etching material. The vacuum chamber 600 includes one or more inputs for inputting chemicals/materials and an output for evacuating chemicals/materials.

According to an embodiment, the first portion 505A containing the substrate 100 is placed in the vacuum chamber 600. The details of the substrate 100 are not shown for conciseness in FIGS. 5A, 5B, and 6, but it is understood that the substrate 100 includes the two large paddles 5A and 5B, the electrode 20A and 20B, the tunnel junction 40, and the shorting strap 10 (along with a readout resonator (not shown) as understood by one skilled in the art).

In FIG. 6, an etchant 605 may be applied to the substrate 100 mounted to the first portion 505A within the vacuum chamber 600. The purpose of the etchant 605 is to etch (i.e., remove) the conductive shorting strap 10 while not affecting the substrate 100, the two large paddles 5A and 5B, the electrode 20A and 20B, and the tunnel junction 40 (along with the readout resonator (not shown)). The conductive shorting strap 10 is completely removed from the substrate 100 while the substrate 100 is mounted to the first portion 505A. The first portion 505A, now serving as an alternative path to the tunnel junction 40, is able to discharge any electrostatic electricity, and thus protects the tunnel junction 40 while the shorting strap 10 is removed. Therefore, the substrate 100 mounted to the first portion 505A can be physically handled by the operator without risk of electrostatic discharge that would normally damage the tunnel junction 40.

In one implementation, the etchant 605 may be a vapor etchant such as, e.g., $XeF_2$. In this case, the conductive shorting strap 10 may be niobium, tantalum, and/or silicon, and the $XeF_2$ removes niobium (tantalum or silicon) conductive shorting strap 10, without etching the other layers on the substrate 100.

In another implementation, the etchant 605 may be a wet etchant whose purpose is to remove the conductive shorting strap 10 without etching the other layers. For example, an organic solvent may be used to remove a conducting polymer as the conductive shorting strap 10 without etching the other layers on the substrate 100.

According to an embodiment, FIG. 7 illustrates the substrate 100 after being removed from the vacuum chamber 600 and after being processed by the etchant 605. At this point, the substrate 100 is still mounted on the first portion 505A of the 3D cavity but the first portion 505A is not shown for clarity. FIG. 7 shows that the conductive shorting strap 10 has been removed. However, the tunnel junction 40 remains protected from electrostatic discharge because of being mounted to the first portion 505A of the 3D cavity.

According to another embodiment, FIG. 8 is a top view illustrating that raised portions 805A and 805B of paddles 5A and 5B may remain at the locations in which the conductive shorting strap 10 previously contacted the paddles 5A and 5B. The raised portions 805A and 805B may be a result of areas in the substrate 100 that did not endure the effects of lithography processing performed after the shorting strap 10 were deposited. Fabrication processing of subsequent layers on the substrate 100 bombards the previously formed paddles 5A and 5B, and this bombardment of physical and chemical processing may reduce the thickness of the paddles 5A and 5B in the z-axis. However, the raised portions 805A and 805B were covered (i.e., protected) by the shorting straps 10 during the bombardment, and thus the raised portions 805A and 805B are not worn away as compared to areas of the paddles 5A and 5B that were uncovered. In FIG. 8, the raised portions 805A and 805B are the actual material of the paddles 5A and 5B but at a higher height in the z-axis. It is noted that the tunnel junction 40 and electrodes 20A and 20B are fabricated subsequent to the shorting strap 10. Additionally, fabrication of the readout resonator (not shown) may be subsequent to fabricating the shorting strap 10.

FIG. 9 illustrates locations 905A and 905B on the paddles 5A and 5B that contain remnants 10A and 10B of the shorting strap 10 itself according to an embodiment. The locations 905A and 905B are the places at which the shorting strap 10 contacted and covered the paddles 5A and 5B. The remnants 10A and 10B of the shorting strap 10 were not completely removed during the etching process by the etchant 605, and thus remain on the paddles 5A and 5B. The material of the remnants 10A and 10B are the same material of the removed shorting strap 10.

FIG. 10 is a conceptual view of a cooling chamber 1000. After the shorting strap 10 has been removed, the first and second portions 505A and 505B are combined together to form the complete 3D cavity (also referred to as a quantum cavity). The substrate 100 is still mounted on the first portion 505A within the 3D cavity. The 3D cavity (the enclosure formed by first and second portions 505A and 505B) is placed into the cooling chamber 1000 for operation and testing as understood by one skilled in the art. The cooling chamber 1000 represents a cryogenic chamber as understood by one skilled in the art.

Figure 11B:
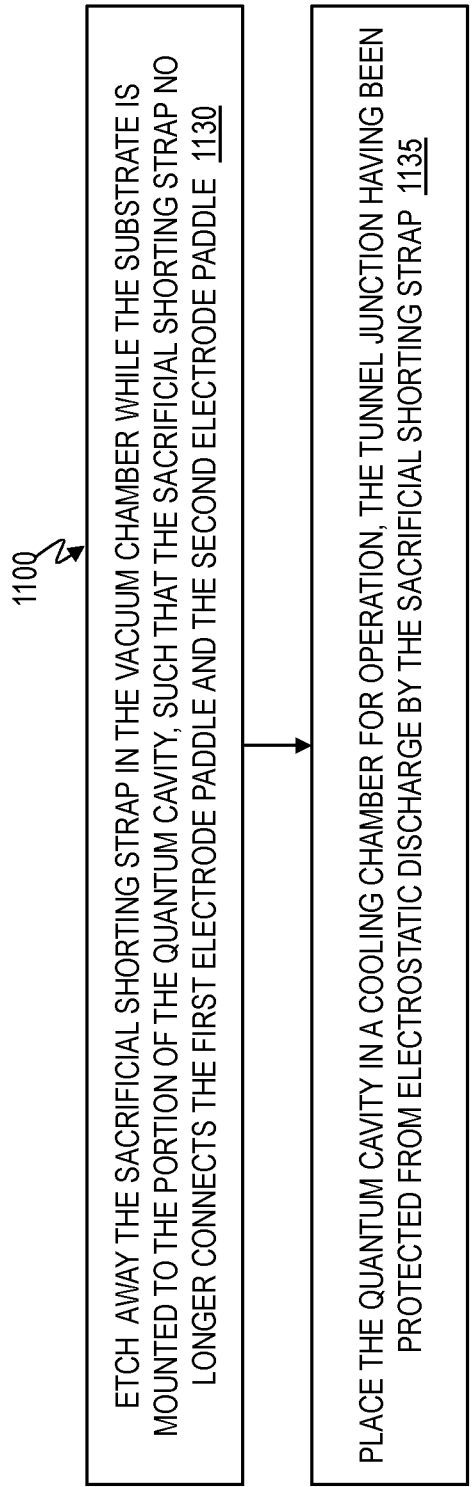

FIGS. 11A and 11B are a method 1100 of providing a sacrificial shorting strap 10 for protecting the tunnel junction 40 of a superconducting qubit according to an embodiment. Reference can be made to FIGS. 1-10.

At block 1105, the first electrode paddle 5A and the second electrode paddle 5B are formed on the substrate 100, where the first electrode paddle 5A and the second electrode paddle 5B oppose one another, as depicted in FIG. 1.

At block 1110, the sacrificial shorting strap 10 is formed on the substrate 100 and the parts of the paddles 5A, 5B, and the sacrificial shorting strap 10 electrically connects the first electrode paddle 5A and the second electrode paddle 5B, as depicted in FIG. 2.

At block 1115, the tunnel junction 40 is formed to electrically connect the first electrode paddle 5A and the second electrode paddle 5B, after forming the sacrificial shorting strap 10. The tunnel junction 40 has electrodes 20A and 20B and insulator 25, as depicted in FIGS. 3 and 4.

At block 1120, the substrate 100 (e.g., a wafer diced into a chip) is mounted the on a portion (e.g., the first portion 505A and/or the second portion 505B) of a quantum cavity, as depicted in FIGS. 5A and 5B.

At block 1125, the portion (e.g., first portion 505A and/or 505B) of the quantum cavity is placed in a vacuum chamber 600, as depicted in FIG. 6.

At block 1130, the sacrificial shorting strap 10 is etched away in the vacuum chamber 600 while the substrate is mounted to the portion (e.g., first portion 505A and/or 505B) of the quantum cavity, such that the sacrificial shorting strap 10 no longer connects the first electrode paddle 5A and the second electrode paddle 5B. The removal of the sacrificial shorting strap 10 is depicted in FIGS. 6 and 7.

At block 1135, the quantum cavity (combination of the first and second portions 505A and 505B) is placed in a cooling chamber 1000 for operation, and the tunnel junction 40 has been protected from electrostatic discharge by the now removed sacrificial shorting strap 10, as depicted in FIG. 10.

When the substrate 100 is mounted on the quantum cavity in the vacuum chamber 600, an etchant 605 is utilized to etch away the sacrificial shorting strap 10 without removing the tunnel junction 40, the first electrode paddle 5A, and the second electrode paddle 5B.

The etchant is a wet etchant that does not attack the tunnel junction 40, the first electrode paddle 5A, and the second electrode paddle 5B. In another case, the etchant 605 is a dry etchant that does not attack the tunnel junction 40, the first electrode paddle 5A, and the second electrode paddle 5B. The dry etchant is $XeF_2$, for example.

Figure 12:
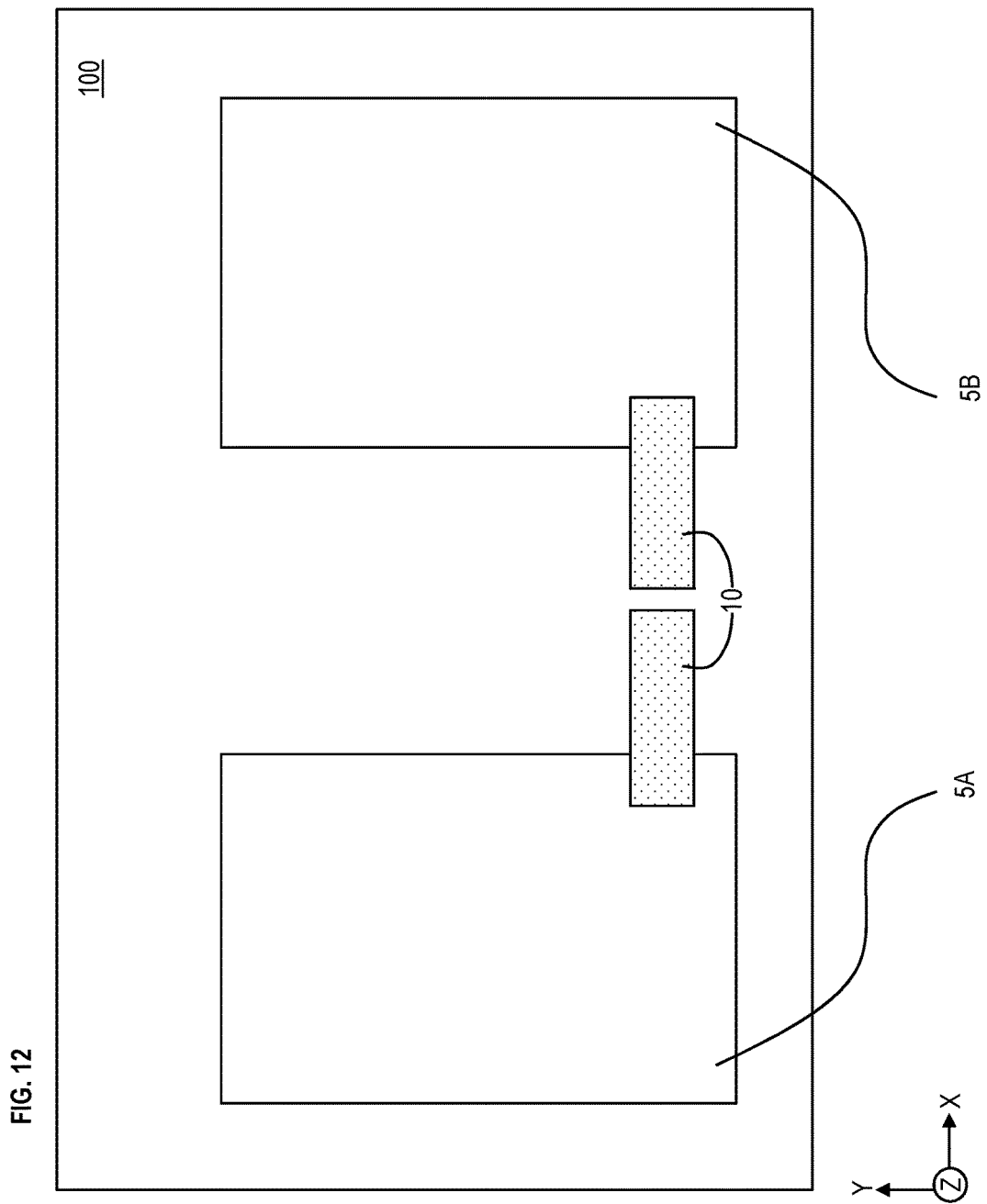
FIG. 12 is a simplified version of cutting the sacrificial shorting strap in two.

When the substrate 100 is mounted on the quantum cavity in the vacuum chamber 600, an etchant 605 is utilized to etch away the sacrificial shorting strap, without requiring the sacrificial shorting strap 10 to be cut in order sever the sacrificial shorting strap, as depicted in FIG. 12. When the substrate is mounted on the quantum cavity in the vacuum chamber 600, an etchant 605 is utilized to etch away the sacrificial shorting strap 10, without leaving the sacrificial shorting strap 10 severed into a first part and a second part opposing each other, as depicted in FIG. 12. FIG. 12 illustrates a simplified version of cutting the sacrificial shorting strap 10 in two, while the sacrificial shorting strap 10 is mounted to the first portion 505A (not shown in FIG. 12). By using the technique discussed in embodiments, the requirement to cut the sacrificial shorting strap 10 while the tunnel junction 40 (not shown in FIG. 12) is already in place is no longer necessary, because the sacrificial shorting strap 10 is removed by the etchant 605.

The tunnel junction 40 is a Josephson junction. The tunnel junction 40 comprises a first superconducting electrode 20A and a second superconducting electrode 20B, where the first superconducting electrode 20A and the second superconducting electrode 20B sandwich an insulator layer 25 as depicted in FIGS. 3 and 4.

The sacrificial shorting strap 10 prevents the insulator layer 25 in the tunnel junction from receiving the electrostatic discharge, thus protecting the insulator layer 25 from becoming defective.

Before etching away the sacrificial shorting strap 10 in the vacuum chamber 600, one end of the sacrificial shorting strap 10 connects at a first location on the first electrode paddle 5A and another end of the sacrificial shorting strap 10 connects at a second location on the second electrode paddle 5B. After etching away the sacrificial shorting strap 10 in the vacuum chamber 600 while the substrate 100 is mounted to the portion of the quantum cavity, the first electrode paddle 5A has a first raised portion 805A at the first location and the second electrode paddle 5B has a second raised portion 805B at the second location, as depicted in FIG. 8. The first raised portion 805A and the second raised portion 805B are material of the first electrode paddle 5A and the second electrode paddle 5B. The first raised portion 805A of the material has a higher height (in the z-axis) at the first location than other areas of the material of the first electrode paddle 5A (i.e., the other areas are not at the location of the raised portion 805A). The second raised portion 805B of the material has a higher height (in the z-axis) at the second location than other areas of the material of the second electrode paddle 5B (i.e., the other areas are not at the location of the second raised portion 805B). The one end and another end of the sacrificial shorting strap 10 covered the first location and the second location during formation of the tunnel junction 40, thus keeping the material at the first location and the second location from wearing away resulting in the first raised portion 805A and the second raised portion 805B.

The first location includes a residual portion 10A of the sacrificial shorting strap 10, and the second location includes another residual portion 10B of the sacrificial shorting strap 10 as depicted in FIG. 9. The residual portion 10A and the other residual portion 10B of the sacrificial shorting strap 10 do not overhang from the first and second electrode paddles, respectively. For example, the residual portion 10A and the another residual portion 10B in contrast to overhanging parts of the sacrificial shorting strap 10 in FIG. 12.

The quantum cavity is a three-dimensional cavity for operating the tunnel junction 40 within the cooling chamber 1000, as depicted in FIG. 10.

It will be noted that various semiconductor device fabrication methods may be utilized to fabricate the components/ elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of forming a protected tunnel junction, the method comprising:
    providing a sacrificial shorting strap connecting a first electrode and a second electrode, wherein a tunnel junction additionally connects the first electrode and the second electrode; and
    etching the sacrificial shorting strap without etching the first electrode, the second electrode, and the tunnel junction, such that the sacrificial shorting strap no longer connects the first electrode and the second electrode, while the tunnel junction continues to connect the first electrode and the second electrode.

2. The method of claim 1, wherein the sacrificial shorting strap is configured to protect the tunnel junction from electrostatic discharge.

3. The method of claim 1, wherein the tunnel junction, the first electrode, and the second electrode are on a substrate.

4. The method of claim 3, wherein the substrate is positioned on a portion of a quantum cavity.

5. The method of claim 1, wherein the sacrificial shorting strap comprises conductive material.

6. The method of claim 4, wherein the quantum cavity is placed in a vacuum chamber.

7. The method of claim 6, further comprising placing the quantum cavity in a cooling chamber for operation, the tunnel junction having been protected from electrostatic discharge by the sacrificial shorting strap.

8. The method of claim 6, wherein, when the substrate is positioned on the quantum cavity in the vacuum chamber, an etchant is utilized to etch the sacrificial shorting strap without removing the tunnel junction, the first electrode, and the second electrode.

9. The method of claim 8, wherein the etchant is a wet etchant that does not attack the tunnel junction, the first electrode, and the second electrode.

10. The method of claim 8, wherein the etchant is a dry etchant that does not attack the tunnel junction, the first electrode, and the second electrode.

11. The method of claim 10, wherein the dry etchant is $XeF_2$.

12. The method of claim 6, wherein, when the substrate is placed on the quantum cavity in the vacuum chamber, an etchant is utilized to etch the sacrificial shorting strap, without requiring the sacrificial shorting strap to be cut in order sever the sacrificial shorting strap.

13. The method of claim 6, wherein, when the substrate is placed on the quantum cavity in the vacuum chamber, an etchant is utilized to etch the sacrificial shorting strap, without leaving the sacrificial shorting strap severed into a first part and a second part opposing each other.

14. The method of claim 1, wherein the tunnel junction is a Josephson junction.

15. The method of claim 1, wherein the tunnel junction comprises a first superconducting electrode and a second superconducting electrode, the first superconducting electrode and the second superconducting electrode sandwiching an insulator layer.

16. The method of claim 15, wherein the sacrificial shorting strap prevents the insulator layer in the tunnel junction from receiving an electrostatic discharge, thus protecting the insulator layer from becoming defective.

17. The method of claim 1, wherein, before etching the sacrificial shorting strap, one end of the sacrificial shorting strap connects at a first location on the first electrode and another end of the sacrificial shorting strap connects at a second location on the second electrode.

18. The method of claim 17, wherein, after etching the sacrificial shorting strap, the first electrode is left with a first raised portion at the first location and the second electrode is left with a second raised portion at the second location.

19. The method of claim 18, wherein the first raised portion and the second raised portion are material of the first electrode and the second electrode;
    wherein the first raised portion of the material has a higher height at the first location than other areas of the material of the first electrode;
    wherein the second raised portion of the material has a higher height at the second location than other areas of the material of the second electrode.

20. The method of claim 4, wherein the quantum cavity is a three-dimensional cavity for operating the tunnel junction within a cooling chamber.

* * * * *